(12) United States Patent
Maes et al.

(10) Patent No.: US 9,184,330 B2
(45) Date of Patent: Nov. 10, 2015

(54) ETCHING OF INFRARED SENSOR MEMBRANE

(71) Applicant: MELEXIS TECHNOLOGIES NV, Tessenderlo (BE)

(72) Inventors: Ben Maes, Lommel (BE); Carl Van Buggenhout, Aalst (BE); Appolonius Jacobus Van Der Wiel, Duisberg (BE)

(73) Assignee: MELEXIS TECHNOLOGIES NV, Tessenderlo (BE)

( * ) Notice: Subject to any disclaimer, the term of this patent is extended or adjusted under 35 U.S.C. 154(b) by 0 days.

(21) Appl. No.: 14/578,701

(22) Filed: Dec. 22, 2014

(65) Prior Publication Data

US 2015/0179861 A1 Jun. 25, 2015

(30) Foreign Application Priority Data

Dec. 24, 2013 (GB) .................... 1322970.3

(51) Int. Cl.
*H01L 31/09* (2006.01)
*H01L 33/34* (2010.01)
(Continued)

(52) U.S. Cl.
CPC . *H01L 31/09* (2013.01); *G01J 5/02* (2013.01); *G01J 5/12* (2013.01); *G01J 5/20* (2013.01); *H01L 27/14669* (2013.01); *H01L 27/14683* (2013.01); *H01L 31/18* (2013.01)

(58) Field of Classification Search
CPC ... H01L 31/09; H01L 31/18; H01L 27/14683; H01L 27/14669; G01J 5/02; G01J 5/12; G01J 5/20; G01J 5/0225
USPC ............ 257/88, 467, 468, 470, 577, E29.062, 257/E29.002, E29.347, E27.036, E21.158; 374/121; 438/51, 53, 54
See application file for complete search history.

(56) References Cited

U.S. PATENT DOCUMENTS 5,600,174 A * 2/1997 Reay et al. .................... 257/467
6,787,052 B1 9/2004 Vaganov
(Continued)

FOREIGN PATENT DOCUMENTS

CN 101665231 A 3/2010
EP 2 076 744 A1 7/2009
(Continued)

OTHER PUBLICATIONS

Great Britain Search Report from Application No. GB 1322970.3, Jul. 29, 2014.
(Continued)

*Primary Examiner* — Dao H Nguyen
(74) *Attorney, Agent, or Firm* — Workman Nydegger (57) ABSTRACT

The invention relates to an infrared thermal sensor comprising a substrate having a cavity, a cavity bottom wall formed by a continuous substrate surface. The sensor comprises a membrane adapted for receiving heat from incident infrared radiation, a beam suspending the membrane, and a thermocouple. This membrane comprises openings extending through the membrane for facilitating the passage of an anisotropic etchant for etching the cavity during manufacture. Each opening has a cross-section with a length to width ratio of at least 4. The width direction of respectively a first and a second set of openings is oriented according to respectively a first crystallographic orientation and a second crystallographic orientation, these orientations corresponding to different directions lying in loosely packed crystal lattice faces of the semiconductor substrate.

15 Claims, 6 Drawing Sheets

(51) Int. Cl.
*G01J 5/02* (2006.01)
*G01J 5/12* (2006.01)
*H01L 27/146* (2006.01)
*G01J 5/20* (2006.01)
*H01L 31/18* (2006.01)

(56) References Cited

U.S. PATENT DOCUMENTS

| | | | |
|---|---|---|---|
| 2003/0062480 A1 | 4/2003 | Kanzaki | |
| 2009/0044630 A1* | 2/2009 | Lapstun et al. | 73/708 |
| 2010/0289108 A1 | 11/2010 | Meinel et al. | |
| 2014/0246749 A1* | 9/2014 | Nam et al. | 257/467 |
| 2014/0291704 A1* | 10/2014 | Ali et al. | 257/88 |
| 2015/0177069 A1* | 6/2015 | Maes et al. | 257/467 |
| 2015/0177070 A1* | 6/2015 | Maes et al. | 257/467 |

FOREIGN PATENT DOCUMENTS

| | | |
|---|---|---|
| EP | 2 333 499 A1 | 6/2011 |
| EP | 2 339 305 A1 | 6/2011 |
| JP | 2013-231738 A | 11/2013 |

OTHER PUBLICATIONS

Extended European Search Report from EP Application No. 14 20 0255, May 29, 2015.

Bassous, Ernest, Fabrication of Novel Three-Dimensional Microstructures by the Anisotropic Etching of (100) and (110) Silicon, IEEE Transactions on Electron Devices, vol. ED-25, No. 10, Oct. 10, 1978, pp. 1178-1185.

* cited by examiner

ETCHING OF INFRARED SENSOR MEMBRANE

FIELD OF THE INVENTION

The invention relates to the field of infrared thermal sensors. More specifically it relates to etching techniques for manufacturing infrared thermal sensors.

BACKGROUND OF THE INVENTION

Any object having a temperature above 0 K will radiate infrared radiation to some extent. Depending on the temperature of the object, the infrared radiation will vary. If the temperature of the object is higher it will radiate more infrared radiation. Therefore, infrared sensors can remotely determine the temperature of an object by measuring the amount of emitted infrared radiation.

Integrated semiconductor infrared thermal sensors are known in the field which absorb the infrared radiation emitted by the object on a membrane which is isolated from the bulk silicon. This membrane will thus heat up due to the absorption of the received infrared radiation. The infrared radiation may furthermore be blocked from the surrounding bulk silicon by an aperture layer such that the bulk silicon only heats up negligibly relative to the membrane. The bulk silicon is furthermore typically substantially more voluminous than the membrane, such that even if the infrared radiation were not blocked, the temperature change in the bulk silicon would still be negligible under normal circumstances since the thermal resistance to the outside is so low that the bulk remains on ambient temperature. The bulk silicon can be seen as a heat sink on a constant temperature. Because the temperature of the bulk will be constant and equal to a reference temperature, e.g. the ambient temperature, the temperature difference between the bulk and the membrane increases when the membrane receives infrared radiation from an object. This temperature difference is therefore a measure for the temperature of the object. By measuring the temperature difference between the membrane and the bulk, the temperature of the object can be deducted.

The temperature difference between the membrane and the silicon bulk can be measured by placing thermocouples between the membrane and the bulk. A thermocouple will generate a voltage difference depending on the temperature difference between the two nodes of the thermocouple and the type of the material. Thermocouples may for example comprise n-type and p-type poly-silicon. It is also possible to place multiple thermocouples together in series to create a larger voltage difference.

Thermocouples may be placed on beams which connect the membrane to the bulk silicon in devices known in the art. All the thermocouples may be connected in a series circuit in order to obtain a large output voltage. However, the thermocouples also have a certain electrical resistance, e.g. depending on the doping, such that connecting all the thermocouples in series will also connect the resistances in series. The total electrical resistance will therefore be the sum of the electrical resistance of each thermocouple.

The temperature difference between the membrane and the silicon bulk is a measure to define the temperature of the object. It is thus advantageous to obtain a large temperature difference. Therefore, the thermal isolation between the membrane and the bulk is preferably very large.

The heat from the membrane can dissipate through the air above and under the membrane. Heat loss via this heat loss path can be reduced by increasing the etch depth, such that the conduction path will become larger and therefore a higher thermal isolation is achieved. Also, a lower pressure in the cavity around the membrane can be used, such that heat loss via conduction and convection is reduced.

The heat from the membrane also dissipates via the beams to the silicon bulk. Longer beams can be used to increase the thermal isolation. Furthermore, decreasing the width of the beams can also increase the isolation.

The conductivity of the beams is typically much higher than the conductivity of the air. However, the membrane has a much greater area exposed to air than to the beams, such that the thermal resistance of both the air and the beams can be important in infrared thermal sensor design.

As is known in the art, the thermal sensor cavity may be a high vacuum cavity. This offers the advantage of substantially reducing the heat loss via the membrane surface, e.g. conductive and convective heat loss are negligible, such that the membrane can only lose heat via radiative heat dissipation via the surface and through the beams. In such devices, it may be preferred to have narrow and long beams. However, for other devices, e.g. in which the cavity is filled with a low pressure gas, a good balance can be reached when the thermal resistance of the surface heat loss path is about equal to the thermal resistance of the beams.

This can be seen by considering the case where the thermal conduction of the air is dominant, such that substantially all the heat is dissipated through the air. In this case, thermocouples can be added to the design without changing the temperature difference between the membrane and the bulk. Since all the heat is conducting through air, adding or removing thermocouples will not change the temperature on the membrane. However, when the thermal conduction through the air is not dominant anymore, the temperature on the membrane will change when a thermocouple is added since the thermal resistance from the membrane to the bulk is changed. However, adding thermocouples will also increase the electrical resistance and therefore also the noise.

When starting from the other extreme in which the thermal conduction of the beams is dominant, e.g. such that substantially all the heat is lost through the beams, thermocouples should be removed from the design to increase the output voltage. Since all the heat is conducting through the beams, the thermal resistance between the membrane and the bulk increases when removing beams. When thermocouples are removed, the width of the remaining thermocouples can be decreased to keep the same total electrical resistance. However, when the thermal conduction is not dominated by the beams anymore, removing beams will not increase the thermal resistance as fast, because some heat will be lost through the air. Thus, an optimum could be reached when the thermal resistance of the air is about equal to the thermal resistance of the beams.

In order to obtain good thermal isolation of the membrane, the beams are preferably under-etched. For this, an anisotropic etchant such as tetramethyl ammonium hydroxide (TMAH) can be used. However, such anisotropic etchant may not etch well in a direction for which the material being etched has a dense configuration in the crystal lattice planes normal to that direction, for example, TMAH cannot etch silicon perpendicularly to the <111> direction. When a side of a window is opened along a <110> edge of a silicon surface cut in the <100> direction, the etched side will be formed by the <111> plane that intersects with the <110> edge. Furthermore, an anisotropic etchant such as TMAH may also not etch in an obtuse angle, although it can etch away a sharp angle very well.

It may be known in the art to use a plurality of holes, e.g. circular holes, provided in the membrane to allow passage of the anisotropic etchant. For example, the United States patent application US 2010/0289108 discloses a thermal sensor device comprising a membrane having such arrangement of etchant holes.

However, it may be a disadvantage of similar devices that a large portion of the surface exposed to incident radiation is removed by the etchant holes, and thus the heat storage capacity and the sensitivity of the device may be reduced. Also, such configuration of etchant holes may reduce the structural integrity of the membrane, e.g. the membrane may be prone to tearing under external forces, e.g. under torque.

SUMMARY OF THE INVENTION

It is an object of embodiments of the present invention to provide a robust and sensitive infrared thermal sensor and a good method for producing such sensor.

It is an advantage of embodiments of the present invention that fast etching can be performed, allowing good release of the membrane.

It is an advantage of embodiments of the present invention that good release of the membrane can be combined with good mechanical integrity of the membrane during and after manufacturing.

It is an advantage of embodiments of the present invention that conventional semiconductor materials can be used for manufacturing the infrared thermal sensor, e.g. that silicon substrates can be used for the manufacturing.

It is an advantage of embodiments of the present invention that good release of the membrane can be obtained, while optimally maintaining the mechanical integrity of the membrane.

The above objective is accomplished by a method and device according to the present invention.

The present invention relates to an infrared thermal sensor comprising a semiconductor substrate having a cavity defined therein. A bottom wall of this cavity is formed by a continuous surface of the semiconductor substrate. The infrared thermal sensor further comprises a membrane disposed in or over the cavity. This membrane is adapted for receiving heat transferred by infrared radiation incident on the membrane. The membrane further comprises a plurality of openings extending through the membrane. The infrared thermal sensor also comprises at least one beam for suspending the membrane over the semiconductor substrate. The infrared thermal sensor further comprises at least one thermocouple disposed in or on the at least one beam. The plurality of openings are adapted for facilitating the passage of an anisotropic etchant for etching the cavity during manufacture of the infrared thermal sensor. At the top surface of the membrane, each opening of the plurality of openings has a cross-section with a length to width ratio of at least 4. The width direction of a first set comprising at least two openings of the plurality of openings is substantially oriented according to a first crystallographic orientation (Y) of the semiconductor substrate, in which this first crystallographic orientation corresponds to a direction lying in a loosely packed crystal lattice face of the semiconductor substrate. The width direction of a second set of the plurality of openings is substantially oriented along a second crystallographic orientation (Z) of the semiconductor substrate, in which the first crystallographic orientation and the second crystallographic orientation correspond to different directions lying in loosely packed crystal lattice faces of the semiconductor substrate.

The first crystallographic orientation (Y) and the second crystallographic orientation (Z) may be substantially orthogonal.

The semiconductor substrate may comprise a semiconductor material having a body-centered cubic lattice structure, and in which said first crystallographic orientation (Y) and said second crystallographic orientation (Z) correspond to crystallographic directions having Miller index <100>.

Each opening of said first set of openings may have at least one opening of the second set of openings as closest neighboring opening.

The at least one beam may be joined to the membrane in a central region of the membrane, said at least one beam being laterally spaced away from the membrane by a plurality of further openings adapted for facilitating the passage of the anisotropic etchant for etching the cavity during manufacture of the infrared thermal sensor.

At the top surface of the membrane, for each opening of the plurality of openings, the minimal area surface segment circumscribed by lines lying in a densely packed crystal lattice plane of the semiconductor substrate may touch or overlap with the corresponding minimal area surface segment of another opening of the plurality of openings or another opening of the plurality of further openings.

At the top surface of the membrane, each opening of the plurality of openings may have a width of at least 4 µm.

Furthermore may comprise a cap contacting said semiconductor substrate such as to seal the cavity air-tight.

The sensor may comprise a gas filling said cavity under a predefined pressure of at least 10 mbar.

Said membrane may have a rounded shape or a convex polygonal shape having at least six corners.

The present invention also relates to a method for manufacturing an infrared thermal sensor. This method comprises providing a membrane stack on a semiconductor substrate. This membrane stack comprises an etch stop layer. The method further comprises patterning the membrane stack such as to define a membrane and at least one beam for suspending the membrane over the semiconductor substrate. The method also comprises forming a plurality of openings in the membrane stack extending through the etch stop layer such that each opening of the plurality of openings has a cross-section with a length to width ratio of at least 4 at the top surface of the membrane. The method also comprises etching a cavity underneath the membrane and the at least one beam using an anisotropic etchant. The method further comprises providing at least one thermocouple in or on the at least one beam. Etching the cavity underneath the membrane comprises forming a bottom wall of the cavity that is defined by a continuous surface of the semiconductor substrate. Forming the plurality of openings comprises providing a first set comprising at least two openings of the plurality of openings. The width direction of this first set is substantially oriented according to a first crystallographic orientation of the semiconductor substrate, in which this first crystallographic orientation corresponds to a direction lying in a loosely packed crystal lattice face of the semiconductor substrate. Forming the plurality of openings also comprises providing a second set of the plurality of openings. The width direction of the second set is substantially oriented along a second crystallographic orientation of the semiconductor substrate, in which the first crystallographic orientation and the second crystallographic orientation correspond to different directions lying in loosely packed crystal lattice faces of the semiconductor substrate.

Forming the plurality of openings may comprise arranging each opening of said first set of openings such as to have at least one opening of the second set of openings as closest neighbouring opening.

The method may further comprise forming a plurality of further openings for laterally spacing away the at least one beam from the membrane such as to join the at least one beam to the membrane in a central region of the membrane.

Forming the plurality of openings comprises arranging each opening of the plurality of openings such that the minimal area surface segment circumscribed by lines lying in a densely packed crystal lattice face of the semiconductor substrate touches or overlaps with the corresponding minimal area surface segment of another opening of the plurality of openings or another opening of the plurality of further openings.

The method furthermore comprises providing a cap contacting said semiconductor substrate such as to seal the cavity air-tight.

The method furthermore comprises filling said cavity with a gas under a predefined pressure of less than 50 mbar.

Etching the cavity may comprise using tetramethyl ammonium hydroxide or KOH as said anisotropic etchant.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

The drawings are only schematic and are non-limiting. In the drawings, the size of some of the elements may be exaggerated and not drawn on scale for illustrative purposes.

Any reference signs in the claims shall not be construed as limiting the scope.

In the different drawings, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

In a first aspect, the present invention relates to an infrared thermal sensor, e.g. an infrared thermal pixel element for integration in a semiconductor device, comprising a semiconductor substrate having a cavity defined therein, a bottom wall of the cavity being formed by a continuous surface of the semiconductor substrate. Furthermore, the sensor comprises a membrane disposed in or over the cavity, in which the membrane is adapted for receiving heat transferred by infrared radiation incident on the membrane. The infrared thermal sensor also comprises at least one beam for suspending the membrane over the semiconductor substrate, and at least one thermocouple disposed in or on the at least one beam.

The membrane comprises a plurality of openings extending through the membrane. This plurality of openings is adapted for facilitating the passage of an anisotropic etchant for etching the cavity during manufacture of the infrared thermal sensor. At the top surface of the membrane, each opening of the plurality of openings has a cross-section with a length to width ratio of at least 4, e.g. is a slit-like opening. Furthermore, the width direction of a first set comprising at least two openings of this plurality of openings is substantially oriented according to a first crystallographic orientation of the semiconductor substrate, in which this first crystallographic orientation corresponds to a direction lying in a loosely packed crystal lattice face of the semiconductor substrate. The width direction of a second set of the plurality of openings is substantially oriented along a second crystallographic orientation of the semiconductor substrate, the first crystallographic orientation and the second crystallographic orientation corresponding to different directions lying in loosely packed crystal lattice faces of the semiconductor substrate. It is an advantage of embodiments of the present invention that the sensor can be manufactured using a fast etching process which allows a good release of the membrane.

Figure 1:
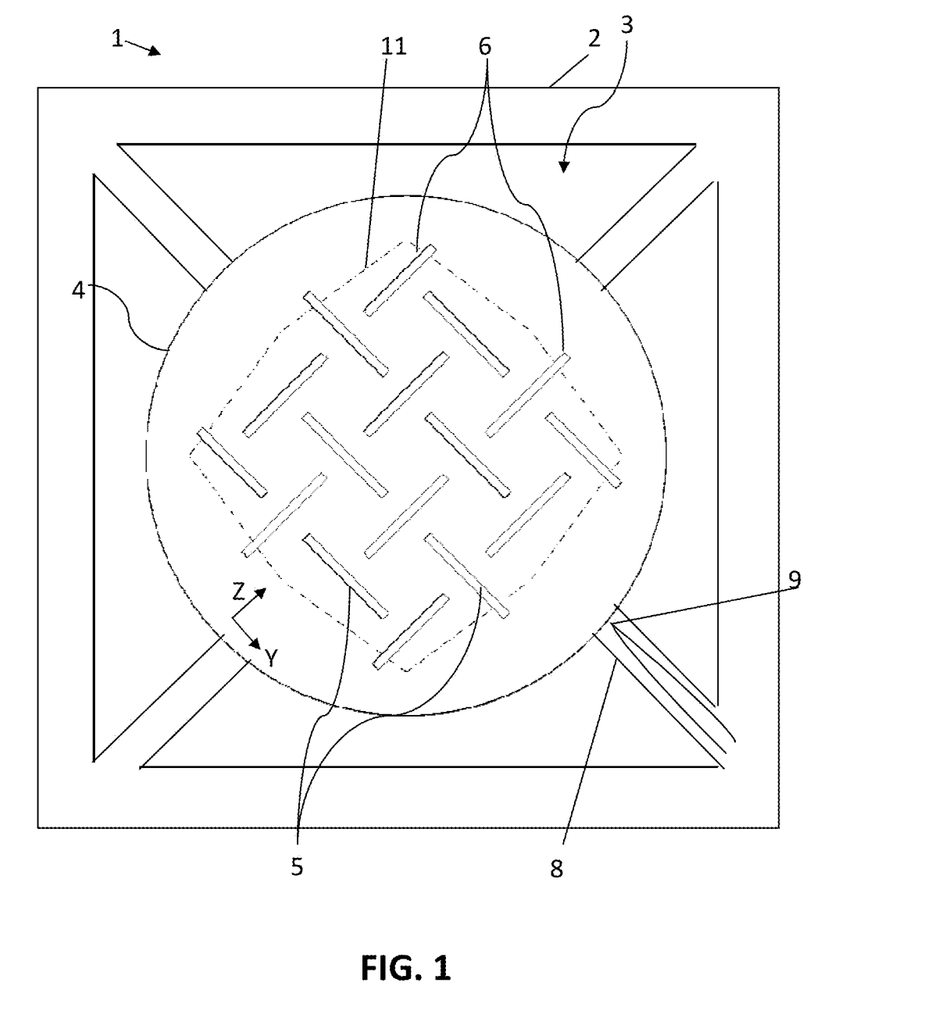
FIG. 1 shows a thermal sensor according to a first exemplary embodiment of the present invention.

Referring to FIG. 1, a first exemplary infrared thermal sensor 1 according to embodiments of the present invention is shown. This sensor 1 comprises a semiconductor substrate 2 having a cavity 3 defined therein. For example, the semiconductor substrate may comprise a thin slice of material such as silicon, aluminium oxide, quartz, sapphire, germanium, gallium arsenide (GaAs), an alloy of silicon and germanium, or indium phosphide (InP). The semiconductor substrate may for example be suitable as the foundation on or in which electronic devices such as transistors, diodes and thermocouples can be disposed to form an integrated circuit. The semiconductor substrate may for example also be suitable for supporting micromechanical constructs, such as, as in the present case, a suspended membrane. The cavity may have a depth, e.g. as measured in a direction perpendicular to the plane of the top surface of substrate, in the range of 20 to 200 µm, for example 50 µm or 100 µm.

A bottom wall of the cavity 3 is formed by a continuous surface of the semiconductor substrate 2. For example, the bottom wall may refer to a concavity defined in the substrate 2 to form the cavity 3. The continuous surface may refer to a surface without holes, e.g. such that the cavity does not connect two opposite major surfaces of the substrate via at least one through hole, as for example could be formed or partially formed by a back-side etching process. The continuous surface may be singly-connected, or 1-connected, e.g. consisting of one piece and not having any holes that pass all the way through it. The continuous surface may be singly-connected, or 1-connected, e.g. being a path-connected surface in which every path between two points on the surface can be continuously transformed, while staying within the surface, into any other such path while preserving the two endpoints in question. It is an advantage of embodiments of the present invention that processing of the device, e.g. manufacturing of the device, can be performed easily and efficiently. For example, in case holes were manufactured that protrude through the substrate to the back side in the cavity, e.g. due to back side etching, further processing of the chips may be complicated. Furthermore, for back side etching, the front features and backside features need to be carefully aligned. Such alignment may be prohibitively difficult for small size sensors, e.g. when the size of the sensor decreases, alignment of front and back features may become more and more difficult. A backside etching step would also need to be carefully controlled to ensure that the back side hole is not too small or too big. Furthermore, when the sensor chip is glued on a carrier, the glue could penetrate a back side hole, if such hole were present. Therefore, glue would have to be applied selectively, which is more difficult than applying glue uniformly. Furthermore, having glue applied only at certain spots may reduce the thermal uniformity, thus potentially resulting in measurement errors.

The infrared thermal sensor 1 also comprises a membrane 4 disposed in or over the cavity 3. For example, during manufacture, the membrane may be provided on the substrate top surface, and the cavity may then be provided by underetching the membrane using an anisotropic etchant, such that in the final product the membrane is disposed over the cavity 3. However, during manufacture, the substrate may also first be etched to provide a first portion of the cavity, the membrane may be provided on the bottom surface of this first portion of the cavity, and a second portion of the cavity may subsequently be provided by underetching the membrane, such that in the final product the membrane is disposed in the cavity. The former may have the advantage of being easier to manufacture, while the latter may have the advantage of providing an easy to seal cavity, e.g. the cavity can be sealed by a flat covering surface.

The membrane is adapted for receiving heat transferred by infrared radiation incident on the membrane 4. For example, the membrane may comprise at least one layer, comprising materials such as doped or undoped semiconductor material, e.g. silicon Si, a semiconductor nitride, e.g. silicon nitride $Si_3N_4$, and/or a semiconductor oxide, e.g. silicon dioxide $SiO_2$. Such materials may have the advantage of possessing good thermal properties and can be easily deposited using standard micro-manufacturing methodology, e.g. by chemical vapour deposition. Furthermore, depending on the properties of the etchant used during manufacture, at least one layer of the membrane may be an etch stop layer, e.g. a silicon dioxide layer, a silicon nitride layer or a p-doped silicon layer, for preventing the anisotropic etchant to remove the membrane material. In a particularly simple embodiment, the front surface of a silicon substrate may be p-doped to act as an etch stop layer, and the membrane may be formed by patterning and etching this doped surface region.

The membrane may have a thickness of a few micrometers, e.g. in the range of 1 µm to 10 µm, e.g. in the range of 2 µm to 5 µm, for example 3 µm. The membrane may have a largest diameter in the range of 100 µm to 1 mm, for example in the range of 300 µm to 600 µm, e.g. 450 µm. The membrane may have any suitable shapes such as a square shape, or, in a preferred embodiment, the membrane may have a rounded shape or a convex polygonal shape having at least six corners. For example, FIG. 1 shows a substantially circular membrane, e.g. a circular membrane. FIG. 1 also shows, for illustrative purposes, an exemplary shape 11 of the etched cavity at its base if anisotropic etching during manufacture were only to occur starting from points on the circumference of the membrane, e.g. without taking the openings described hereinbelow into account.

Figure 5:
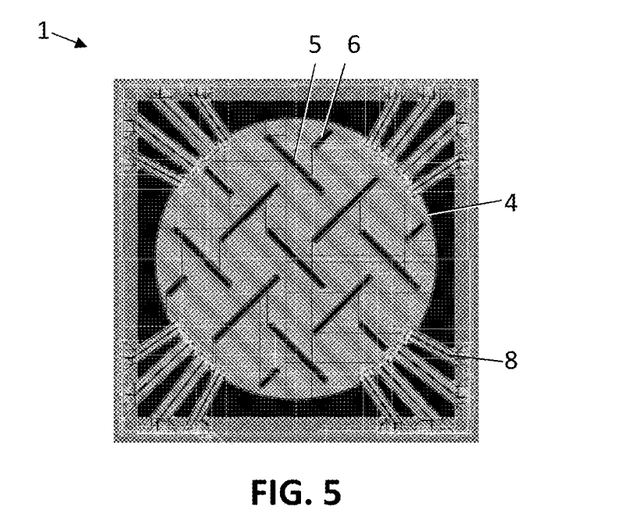
FIG. 5 shows a third exemplary beam support arrangement in a thermal sensor according to embodiments of the present invention.

The infrared thermal sensor 1 further comprises at least one beam 8 for suspending the membrane 4 over the semiconductor substrate 2, and at least one thermocouple 9 disposed in or on said at least one beam 8. The at least one beam 8 may be joined to the membrane in an edge region of the membrane 4, e.g. may connect to the edge of the membrane, as shown in FIG. 1. The number of beams and arrangement of the beams may vary, as will be apparent to the person skilled in the art. For example, while FIG. 1 shows four beams disposed at relative angles of substantially 90°, FIG. 5 shows an arrangement in which four groups of beams are disposed at angles of substantially 90° with respect to one other, in which each group comprises a plurality of beams, e.g. four beams. Furthermore, each beam may be arranged along or close to a direction lying in a loosely packed crystal lattice face of the semiconductor substrate, e.g. may be within a margin of 10° from such preferred etching direction.

Figure 3:
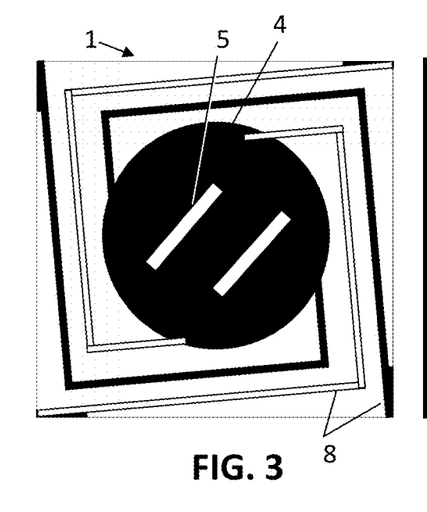
FIG. 3 shows an exemplary beam support arrangement for a membrane in a thermal sensor according to embodiments of the present invention.
Figure 8:
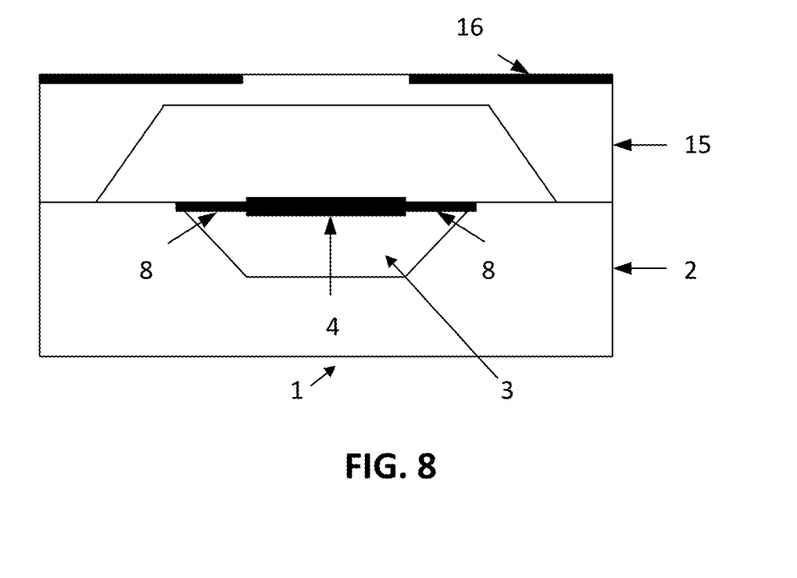
FIG. 8 shows a schematic side view of a thermal sensor according to embodiments of the present invention.

It may be advantageous to increase the length of the beams without substantially changing the footprint area of the cavity. This may be particularly advantageous in embodiments in which the cavity is a high-vacuum cavity, e.g. vacuum sealed under a cap 15 provided over the membrane and the cavity, e.g. as schematically illustrated in FIG. 8. In such embodiments, the heat loss through the surface area of the membrane will not occur via gas convection and conduction, such that the dominant heat loss path will be via heat conduction of the beams. FIG. 3 shows an exemplary embodiment in which the beams are not straight, but bent around the membrane, e.g. bent in right angles, to increase the length of the beams without increasing the area of the cavity.

However, in other embodiments, the at least one beam 8 may be joined to the membrane 4 in a connection region spaced away from the outer edge of the membrane 4, for example the at least one beam may be partially surrounded by the membrane, e.g. the at least one beam may be joined to the membrane in a central region of the membrane. Extending the beam to the center in accordance with embodiments of the present invention has the advantage that the thermal resistance increases.

Figure 2:
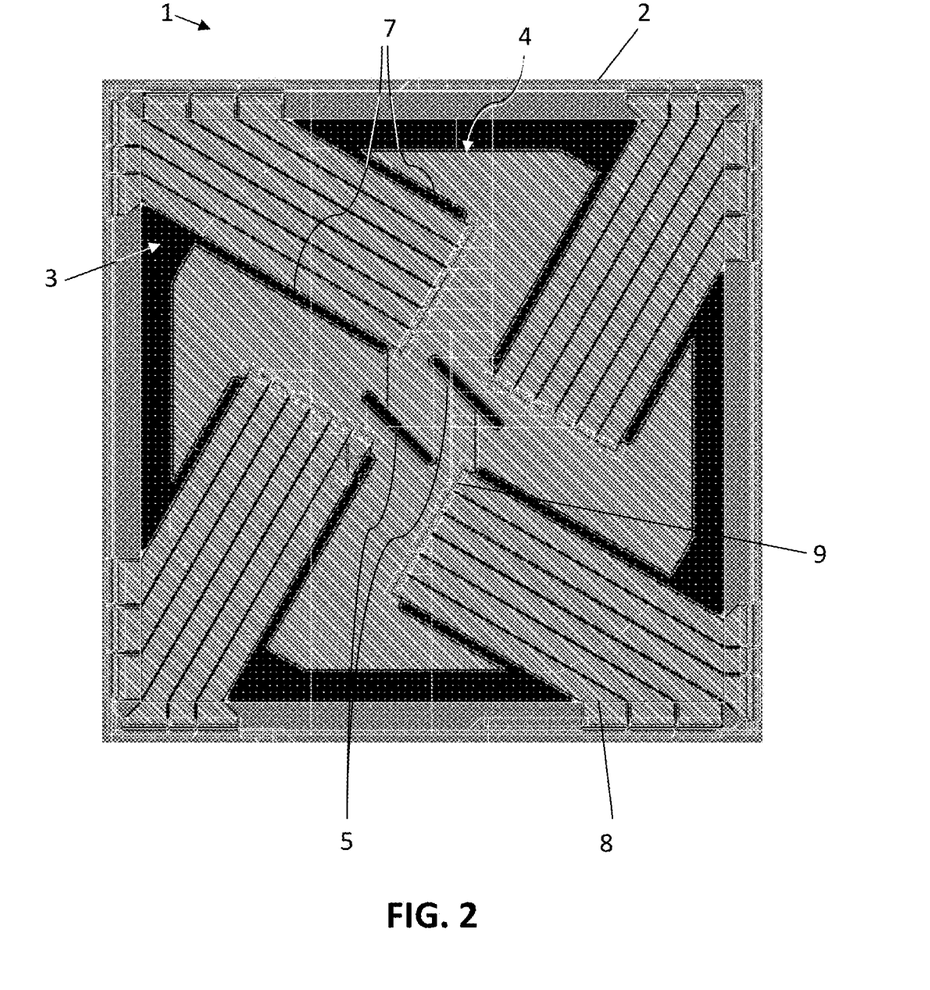
FIG. 2 shows a thermal sensor according to a second exemplary embodiment of the present invention.

As shown in FIG. 2, the at least one beam 8 may be laterally spaced away from the membrane 4 by at least one further opening 7 adapted for facilitating the passage of the anisotropic etchant for etching the cavity during manufacture of the infrared thermal sensor. Thus, the length of the beams may be increased in a simple manner while maintaining a good structural support of the membrane. It is furthermore an advantage that the membrane can cover a large area in relation to the area covered by the cavity, e.g. such that a good sensitivity to infrared radiation incident on the membrane is achieved.

Figure 4:
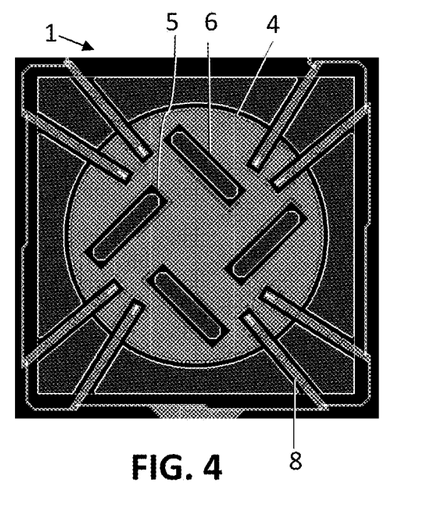
FIG. 4 shows a further exemplary beam support arrangement in a thermal sensor according to embodiments of the present invention.

The at least one beam 8 may be spaced away from the membrane 4 by a plurality of further openings adapted for facilitating the passage of the anisotropic etchant for etching the cavity 3 during manufacture of the infrared thermal sensor 1. For example, as shown in FIG. 2, each beam may have two lateral openings spacing it away from the membrane. Where FIG. 2 shows four wide beams substantially uniformly distributed by an angular offset of about 90°, in the example shown in FIG. 4, the beams are arranged in groups of two beams, in which the groups are arranged at 90° angles with respect to each other.

The at least one thermocouple 9 may be adapted for generating a signal, e.g. a voltage difference, corresponding to a temperature difference between a hot junction and a cold junction, e.g. indicative of a temperature increase of the membrane due to infrared radiation incident thereon with respect to a bulk reference, e.g. a temperature of the semiconductor substrate.

Furthermore, in accordance with embodiments of the present invention, the membrane 4 comprises a plurality of openings 5,6 extending through the membrane 4. This plurality of openings 5,6 is adapted for facilitating the passage of an anisotropic etchant, such as ethylene diamine pyrochatechol (EDP) and water, tetramethyl ammonium hydroxide (TMAH) or potassium hydroxide (KOH), for etching the cavity 3 during manufacture of the infrared thermal sensor 1. Particularly, the cavity 3 may be etched during manufacture by an underetching process, e.g. a front-side etching, facilitated by the openings 5,6. At the top surface of the membrane, each opening of the plurality of openings has a cross-section with a length to width ratio of at least 4, e.g. the openings may be elongate openings, e.g. linear slits. For example, such elongate openings may have a width of 4 µm or less and a length of at least 40 µm, e.g. a width of 5 µm and a length of 50 µm or a width of 10 µm and a length of 100 µm. The openings may for example be separated by a distance of at least 10 µm, for example 15 µm or 30 µm. Thus, at the top surface of the membrane, each opening of the plurality of openings 5,6 may have a width of 4 µm or less.

The width direction, e.g. a direction oriented along a smallest dimension of the cross-section, of a first set 5 comprising at least two openings of this plurality of openings is substantially oriented according to a first crystallographic orientation Y of the semiconductor substrate. This first crystallographic orientation Y corresponds to a direction lying in a loosely packed crystal lattice face of the semiconductor substrate. Thus, the first crystallographic orientation may correspond to a preferential etching direction, e.g. a most preferred etching direction, with respect to the lattice structure for which the etching by the anisotropic etchant progresses at a high rate, e.g. at least a factor 5 times faster than the etching rate in a direction for which the anisotropic etchant progresses at a minimal etching rate. This high rate may for example be a substantially maximum rate, e.g. a maximum rate, relative to etching rates in different directions. For example, this first crystallographic direction Y may correspond to a <100> direction in a body centred cubic lattice structure of the semiconductor substrate, e.g. the crystal structure of silicon.

Furthermore, in embodiments according to the present invention, e.g. as shown in FIG. 1, the width direction of a second set 6 of the plurality of openings may be substantially oriented along a second crystallographic orientation Z of the semiconductor substrate. The first crystallographic orientation Y and the second crystallographic orientation Z may correspond to different directions lying in loosely packed crystal lattice faces of the semiconductor substrate. Thus, also the second crystallographic orientation may correspond to a preferential etching direction with respect to the lattice structure for which the etching by the anisotropic etchant progresses at a high rate, however the first crystallographic orientation and the second crystallographic orientation may differ substantially, e.g. may be separated by an angle of at least 50°. It is an advantage of embodiments of the present invention that good release of the membrane can be combined with good mechanical integrity of the membrane during and after manufacturing.

In embodiments according to the present invention, the first crystallographic orientation and the second crystallographic orientation may be substantially orthogonal, e.g. may be orthogonal. For example, the first and second crystallographic direction may correspond to different crystallographic directions having Miller index <100>, e.g. the <010> and the <001> direction, in a body centered cubic lattice structure of the semiconductor substrate, e.g. the crystal structure of silicon. Thus, it is an advantage of embodiments of the present invention that conventional semiconductor materials can be used for manufacturing the infrared thermal sensor, e.g. that silicon substrates can be used for the manufacturing.

In embodiments according to the present invention, each opening of the first set of openings 5 may have at least one opening of the second set of openings 6 as closest neighbouring opening. Thus, a good release of the membrane can be obtained by underetching during manufacture, while optimally maintaining the mechanical integrity of the membrane. Furthermore, a high etching rate can be obtained while receiving and storing heat over a large surface area.

Figure 6:
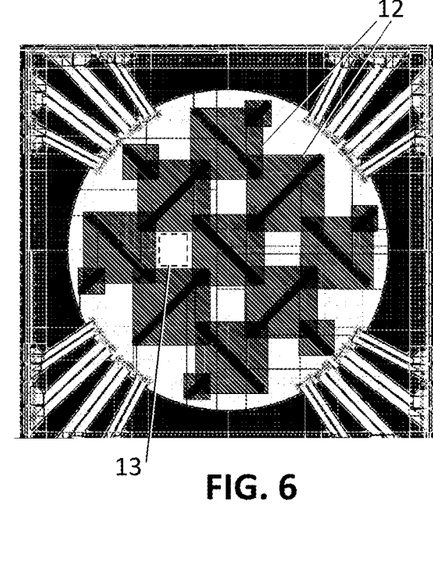
FIG. 6 illustrates overlapping etch areas for the thermal sensor according to the third exemplary embodiment of the present invention also shown in FIG. 5.
Figure 7:
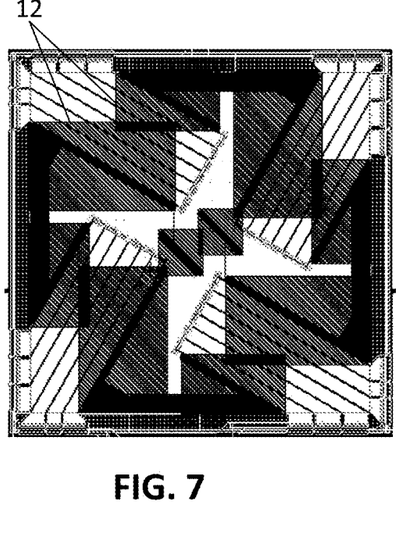
FIG. 7 illustrates overlapping etch areas for the thermal sensor according to the second exemplary embodiment of the present invention.

At the top surface of the membrane, for each opening of the plurality of openings 5,6, and/or the further openings 7 if present, the minimal area surface segment circumscribed by lines lying in a densely packed crystal lattice face of the semiconductor substrate, e.g. along <011> directions lying in {111} planes in a silicon substrate, touches or overlaps with the corresponding minimal area surface segment of another opening of the plurality of openings or another opening of the plurality of further openings. This is illustrated in FIG. 6 for the exemplary embodiment shown also in FIG. 5, and in FIG. 7 for the second exemplary embodiment of FIG. 2. The minimum area surface segments 12, e.g. the smallest surface segment enclosing an opening which is circumscribed by lines lying in such densely packed crystal lattice plane, are shown in FIG. 6 and FIG. 7 overlapping neighbouring minimum area surface segments by a small margin. By touching or overlapping neighbouring surface segments, the etching efficiently progresses by joining neighbouring cavities, such that also the convex areas 13 of unetched material enclosed by the minimum area surface segments may be etched away by the anisotropic etchant during manufacture.

Referring to FIG. 8, the infrared thermal sensor 1 according to embodiments may also comprise a cap 15 contacting the semiconductor substrate such as to seal the cavity 3 airtight, as is known as a conventional measure for sealing infrared sensors in the art. The infrared thermal sensor may for example comprise a gas filling the cavity, e.g. the sealed cavity, under a predefined pressure of at about 10 mbar. However, in other embodiments, the cap 15 may substantially preserve a high-quality vacuum in the cavity, e.g. a high vacuum in the range of 10 mbar to $10^{-2}$ mbar.

The infrared thermal sensor 1 may also comprise other components as known in the field, e.g. electronics for conducting, amplifying and/or processing signal which are provided by the at least one thermocouple. Another example of an optional component for such thermocouple, as known to the person skilled in the art, is an aperture layer 16 for collimating the incident infrared radiation, e.g. for obscuring the bulk substrate from infrared radiation while allowing infrared radiation to reach the membrane.

Figure 9:
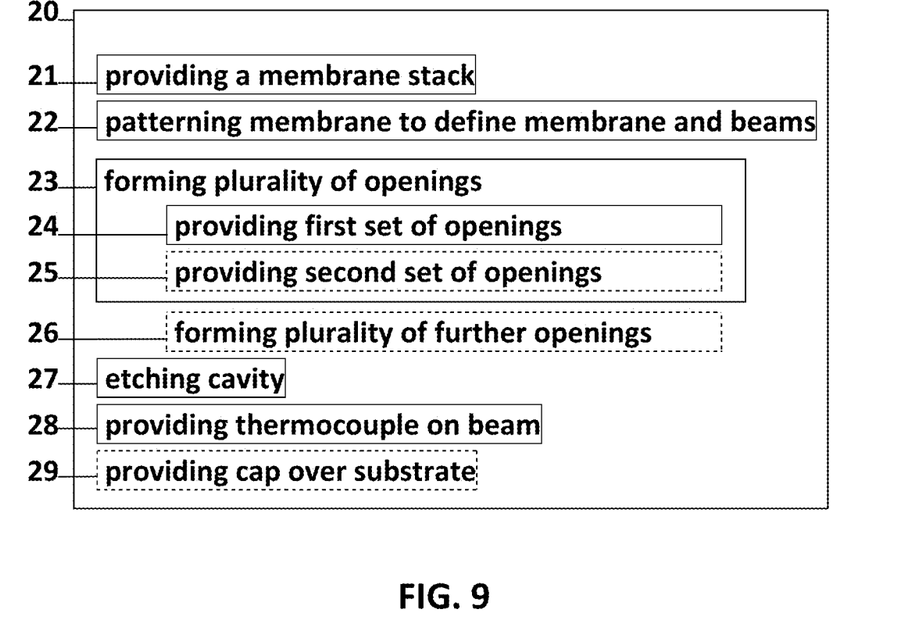
FIG. 9 illustrates a method according to embodiments of the present invention.

In a second aspect, the present invention also relates to a method for manufacturing an infrared thermal sensor. FIG. 9 illustrates such method 20 according to embodiments of the present invention. The method 20 comprises providing 21 a membrane stack on a semiconductor substrate, e.g. a silicon wafer substrate, in which the membrane stack comprises an etch stop layer, silicon dioxide layer or a nitride layer, for example as described hereinabove relating to the membrane of embodiments of the first aspect of the present invention. Where reference is made to a membrane stack, it will be apparent to the person skilled in the art that such stack comprises at least one layer of material, e.g. consisting of only a single layer which is also suitable as etch stop material, for example a plurality of layers having suitable thermal, mechanical and chemical properties, as known in the art for manufacturing thermal sensors.

The method 20 further comprises patterning 22 the membrane stack such as to define a membrane and at least one beam for suspending the membrane over the semiconductor substrate. For example, the patterning may comprise applying a photolithographic method. It shall be clear to the person skilled in the art that such patterning may comprise the step of forming a plurality of openings in the membrane stack as described hereinbelow, e.g. a single mask may be applied to the membrane stack to define the openings, the membrane contours and the beam contours, and even further features of the device, such as parts of electronic components, conductive paths or other micromechanical constructs.

The method 20 also comprises forming 23 a plurality of openings in the membrane stack extending through the etch stop layer such that at the top surface of the membrane, each opening of the plurality of openings has a cross-section with a length to width ratio of at least 4. Forming the plurality of openings comprises providing 24 a first set comprising at least two openings of the plurality of openings, in which the width direction of this first set is substantially oriented according to a first crystallographic orientation of the semiconductor substrate. The first crystallographic orientation corresponds to a direction lying in a loosely packed crystal lattice face of the semiconductor substrate. For example, a lithographic step for providing the openings may be aligned with a crystal orientation indicator, e.g. a wafer flat, to orient the openings according to this first crystallographic orientation.

Forming the plurality of openings may also comprise providing 25 a second set of the plurality of openings, in which the width direction of the second set is substantially oriented along a second crystallographic orientation of the semiconductor substrate. The first crystallographic orientation and the second crystallographic orientation may correspond to different directions lying in loosely packed crystal lattice faces of the semiconductor substrate.

Forming the plurality of openings may comprise arranging each opening of the first set of openings such as to have at least one opening of the second set of openings as closest neighbouring opening. For example, the openings may be provided according to a tiling of the membrane, in which the tiles alternate between the first orientation and the second orientation, or in which the tiles alternate between a tile in the first orientation, an tile without opening, a tile in the second orientation and again a tile without opening. Such tiling sequence may be applied in two directions, e.g. in two substantially orthogonal directions.

The method may also comprise forming 26 a plurality of further openings for laterally spacing away the at least one beam from the membrane such as to join the at least one beam to the membrane in a central region of the membrane, e.g. in a region spaced away from the edge of the membrane.

The method 20 comprises etching 27 a cavity underneath the membrane and the at least one beam using an anisotropic etchant, e.g. underetching the membrane and the at least one beam. This etching may comprise a front-side etching, e.g. the etchant may act from an initial application volume on top of the membrane, e.g. acting through the openings from above. Etching the cavity may comprise using tetramethyl ammonium hydroxide (TMAH) as the anisotropic etchant. This etchant advantageously comprises no alkali ions, such that this etchant may have a good compatibility with CMOS device manufacture. Although the etching of the membrane may not require CMOS compatibility directly, TMAH also has the advantage of not implying a risk of contamination for other manufacturing processes, e.g. CMOS manufacturing steps, subsequently performed on the same device or in the same manufacturing environment. The silicon plane selectivity of TMAH, e.g. <100>:<111> in the range of 10:1 to 35:1, may be used to define the first and/or second crystallographic direction. The membrane stack may for example comprise silicon dioxide $SiO_2$ as etch stop layer for such embodiments.

Alternatively, etching the cavity may comprise using potassium hydroxide (KOH), e.g. the anisotropic silicon plane selectivity of <110>:<100>:<111>=600:400:1 may be used to define the first and/or second crystallographic direction, and the membrane stack may comprise $Si_3N_4$ or preferably $SiO_2$ as etch stop layer.

As another exemplary etchant, ethylene diamine pyrochatechol (EDP) and water may be used, e.g. having a plane selectivity of <100>:111>=35:1 in silicon, and silicon dioxide may be used as a suitable etch stop layer.

Forming the plurality of openings may comprise arranging each opening of the plurality of openings such that the minimal area surface segment circumscribed by lines lying in a densely packed crystal lattice plane of the semiconductor substrate touches or overlaps with the corresponding minimal area surface segment of another opening of the plurality of openings or, in embodiments where such further openings are provided, another opening of the plurality of further openings.

The method 20 further comprises providing 28 at least one thermocouple in or on the at least one beam.

The method 20 may also comprise providing 29 a cap contacting the semiconductor substrate such as to seal the cavity air-tight. The method 20 may further comprise filling the cavity with a gas under a predefined pressure of 50 mbar or less. Alternatively, the method 20 may comprise providing a vacuum in the cavity.

Figure 10:
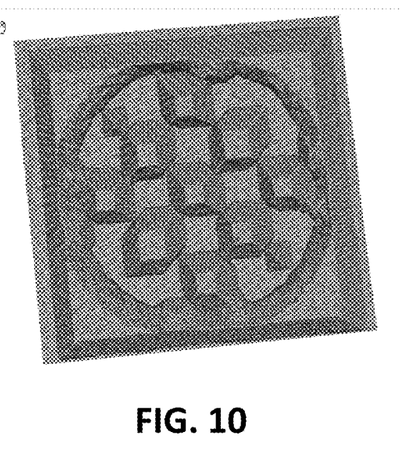
FIG. 10 shows a simulation of an etching process for the thermal sensor according to the third exemplary embodiment of the present invention with an etch depth of about half the slit length.
Figure 11:
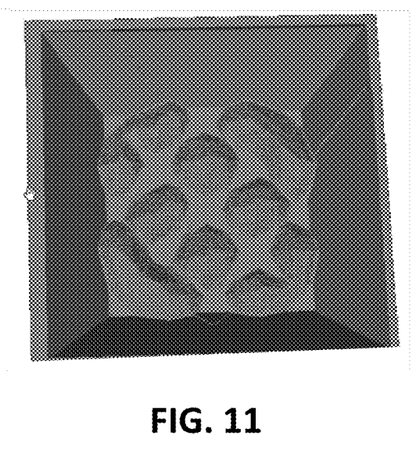
FIG. 11 shows a simulation of an etching process for the thermal sensor according to the third exemplary embodiment of the present invention with and etch depth of about the slit length.
Figure 12:
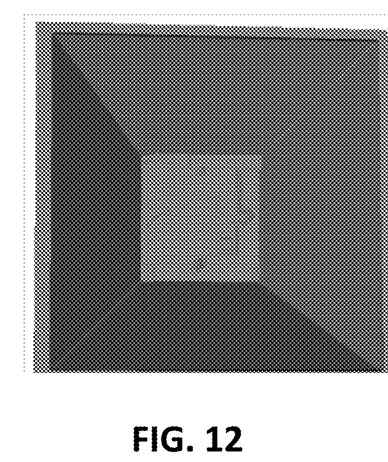
FIG. 12 shows a simulation of an etching process for the thermal sensor according to the third exemplary embodiment of the present invention with a depth of about 1.5 times the slit length.
Figure 13:
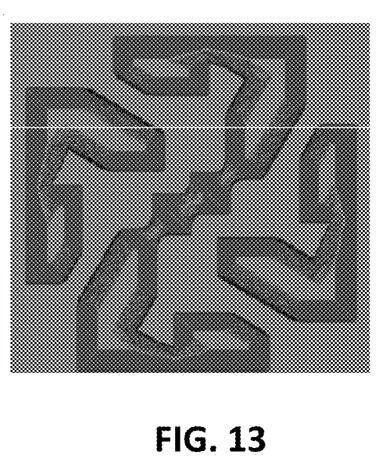
FIG. 13 shows a simulation of an etching process for the thermal sensor according to the second exemplary embodiment of the present invention with and etch depth of 10% of the cavity diameter.
Figure 14:
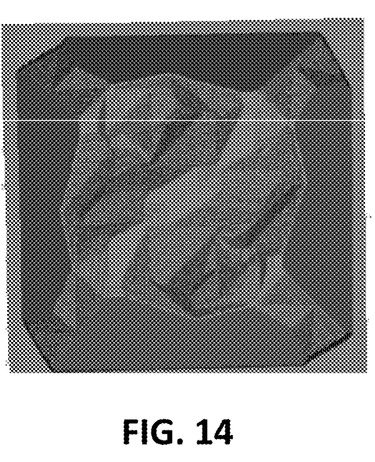
FIG. 14 shows a simulation of an etching process for the thermal sensor according to the second exemplary embodiment of the present invention with and etch depth of 30% of the cavity diameter.
Figure 15:
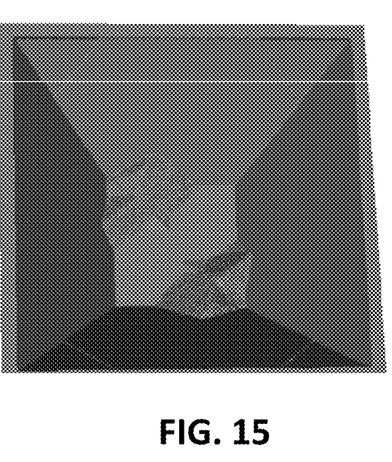
FIG. 15 shows a simulation of an etching process for the thermal sensor according to the second exemplary embodiment of the present invention with and etch depth of 50% of the cavity diameter.

FIG. 10 to FIG. 12 illustrate a simulation of an under-etching process for the device shown in FIG. 5 and FIG. 6. FIG. 10 shows the etched volume at 10 minutes after applying the TMAH etchant resulting in a depth of about half the slit length. FIG. 11 and FIG. 12 show the etched volume after respectively 30 minutes and 50 minutes or with a depth of about the slit length and 1.5 times the slit length. As a further example, FIG. 13 to FIG. 15 illustrate a simulation of an under-etching process for the device shown in FIG. 2 and FIG. 7. FIG. 13 shows the etched volume at 10 minutes after applying the TMAH etchant resulting in a depth of about 10% of the pixel length. FIG. 14 and FIG. 15 show the etched volume after respectively 30 minutes and 50 minutes or a depth of about 30 and 50% of the pixel length. Thus, it can be seen that a fast and good separation of the membrane and beams can be achieved in accordance with embodiments of the present invention.

Figure 16:
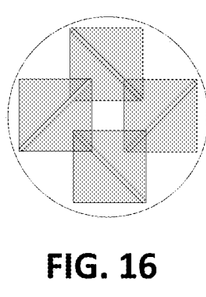
FIG. 16 shows an arrangement of a small number of openings in a thermal sensor according to embodiments of the present invention.
Figure 17:
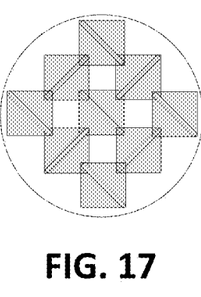
FIG. 17 shows an arrangement of a mid-range number of openings in a thermal sensor according to embodiments of the present invention.
Figure 18:
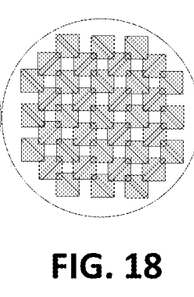
FIG. 18 shows an arrangement of a large number of openings in a thermal sensor according to embodiments of the present invention.

FIG. 16 to FIG. 18 illustrate the effect of varying the number and length of the openings provided in the membrane. The openings may preferably be as long as possible given the constraints described hereinbelow. Shorter openings may be less efficient due to a larger overlap requirement of the minimum area surface segments defined hereinabove, e.g. the square areas shown on FIG. 16 to FIG. 18. Such overlaps may provide additional areas through which the etchant can efficiently act on the substrate material to remove. Overlap is not necessary in principle, although the minimum area surface segments preferably at least touch one another to allow a good overflow of the etching process between the segments, e.g. into enclosed convex areas in which no opening is present. However, the overlap may provide some redundancy, which may be more significant for smaller openings. Assuming the width of the openings is maintained constant, e.g. defined by a process constraint, the area of the opening compared to the area of the minimum surface segment which will be etched away by etchant acting through this opening will be larger for shorter slits. Therefore the opening makes less efficient use of the available area. However, the openings should not be too long, because then the minimum surface segments will not be fully etched away, depending on the etching process.

FIG. 16 to FIG. 18 show membranes having a diameter of 354 µm, and an area, discounting the openings, of 98422.96 µm². The openings are slits of 8 µm width. FIG. 16 shows 4 slits of 174 µm length, FIG. 17 shows 9 slits of 103 µm length, and FIG. 18 shows 37 slits of 50 µm length. These figures correspond to respective areas of the openings of 5568 µm², 7416 µm² and 14800 µm². The design with the longest slits may be the most efficient in area but the squares won't be etched away fully due to the process, making the mid-range slit length the more overall efficient design.

The invention claimed is:

1. An infrared thermal sensor comprising:
   a semiconductor substrate having a cavity defined therein, wherein a bottom wall of said cavity is formed by a continuous surface of the semiconductor substrate,
   a membrane disposed in or over said cavity, the membrane being adapted for receiving heat transferred by infrared radiation incident on said membrane, said membrane comprising a plurality of openings extending through the membrane,
   at least one beam for suspending the membrane over the semiconductor substrate, and
   at least one thermocouple disposed in or on said at least one beam,
   wherein said plurality of openings are adapted for facilitating the passage of an anisotropic etchant for etching the cavity during manufacture of the infrared thermal sensor,
   wherein at the top surface of the membrane, each opening of the plurality of openings has a cross-section with a length to width ratio of at least four,
   wherein the width direction of a first set comprising at least two openings of said plurality of openings is substantially oriented according to a first crystallographic orientation of the semiconductor substrate, said first crystallographic orientation corresponding to a direction lying in a loosely packed crystal lattice face of the semiconductor substrate, and
   wherein the width direction of a second set of said plurality of openings is substantially oriented along a second crystallographic orientation of the semiconductor substrate, said first crystallographic orientation and said second crystallographic orientation corresponding to different directions lying in loosely packed crystal lattice faces of the semiconductor substrate.

2. The infrared thermal sensor according to claim 1, in which the first crystallographic orientation and the second crystallographic orientation are substantially orthogonal.

3. The infrared thermal sensor according to claim 2, in which said semiconductor substrate comprises a semiconductor material having a body-centered cubic lattice structure, and in which said first crystallographic orientation and said second crystallographic orientation correspond to crystallographic directions having Miller index <100>.

4. The infrared thermal sensor according to claim 1, in which each opening of said first set of openings has at least one opening of the second set of openings as closest neighboring opening.

5. The infrared thermal sensor according to claim 1, wherein the at least one beam is joined to the membrane in a central region of the membrane, said at least one beam being laterally spaced away from the membrane by a plurality of further openings adapted for facilitating the passage of the anisotropic etchant for etching the cavity during manufacture of the infrared thermal sensor.

6. The infrared thermal sensor according to claim 1, in which at the top surface of the membrane, for each opening of the plurality of openings, the minimal area surface segment circumscribed by lines lying in a densely packed crystal lattice plane of the semiconductor substrate touches or overlaps with the corresponding minimal area surface segment of another opening of the plurality of openings or, in which each opening of said first set of openings has at least one opening of the second set of openings as closest neighboring opening, another opening of the plurality of further openings.

7. The infrared thermal sensor according to claim 1, furthermore comprising a cap contacting said semiconductor substrate such as to seal the cavity air-tight.

8. The infrared thermal sensor according to claim 1, in which said membrane has a rounded shape or a convex polygonal shape having at least six corners.

9. A method for manufacturing an infrared thermal sensor, the method comprising:
   providing a membrane stack on a semiconductor substrate, said membrane stack comprising an etch stop layer,
   patterning the membrane stack such as to define a membrane and at least one beam for suspending the membrane over the semiconductor substrate,
   forming a plurality of openings in said membrane stack extending through the etch stop layer such that at the top surface of the membrane, each opening of the plurality of openings has a cross-section with a length to width ratio of at least four,
   etching a cavity underneath the membrane and the at least one beam using an anisotropic etchant, and
   providing at least one thermocouple in or on said at least one beam,
   wherein etching the cavity underneath the membrane comprises forming a bottom wall of said cavity defined by a continuous surface of the semiconductor substrate,
   herein forming the plurality of openings comprises providing a first set comprising at least two openings of said plurality of openings, the width direction of said first set being substantially oriented according to a first crystallographic orientation of the semiconductor substrate, said first crystallographic orientation corresponding to a direction lying in a loosely packed crystal lattice face of the semiconductor substrate, and
   wherein forming the plurality of openings comprises providing a second set of said plurality of openings, the width direction of the second set being substantially oriented along a second crystallographic orientation of the semiconductor substrate, said first crystallographic orientation and said second crystallographic orientation corresponding to different directions lying in loosely packed crystal lattice faces of the semiconductor substrate.

10. The method according to claim 9, wherein forming the plurality of openings comprises arranging each opening of said first set of openings such as to have at least one opening of the second set of openings as closest neighboring opening.

11. The method according to claim 9, further comprising forming a plurality of further openings for laterally spacing away the at least one beam from the membrane such as to join the at least one beam to the membrane in a central region of the membrane.

12. The method according to claim 9, wherein forming the plurality of openings comprises arranging each opening of the plurality of openings such that the minimal area surface segment circumscribed by lines lying in a densely packed crystal lattice face of the semiconductor substrate touches or overlaps with the corresponding minimal area surface segment of another opening of the plurality of openings or, wherein further comprising forming a plurality of further openings for laterally spacing away the at least one beam from the membrane such as to join the at least one beam to the membrane in a central region of the membrane, another opening of the plurality of further openings.

13. The method according to claim 9, furthermore comprising providing a cap contacting said semiconductor substrate such as to seal the cavity air-tight.

14. The method according to claim 13, furthermore comprising filling said cavity with a gas under a predefined pressure of less than 50 mbar.

15. The method according to claim 9, wherein etching the cavity comprises using tetramethyl ammonium hydroxide or KOH as said anisotropic etchant.

* * * * *